United States Patent [19]

Riggio, Jr.

[11] Patent Number: 5,596,280
[45] Date of Patent: Jan. 21, 1997

[54] APPARATUS AND METHOD FOR TESTING CIRCUITS BY THE RESPONSE OF A PHASE-LOCKED LOOP

[75] Inventor: Salvatore R. Riggio, Jr., Boca Raton, Fla.

[73] Assignee: International Business Machines Corp., Armonk, N.Y.

[21] Appl. No.: 491,020

[22] Filed: Jun. 15, 1995

[51] Int. Cl.$^6$ .......................... G01R 27/02; H01H 31/02
[52] U.S. Cl. .......................... 324/606; 324/537; 324/683
[58] Field of Search ................................. 324/158.1, 521, 324/537, 606, 607, 667, 683, 707, 709

[56] References Cited

U.S. PATENT DOCUMENTS

| | | | |
|---|---|---|---|
| 3,973,198 | 8/1976 | Hunt | 324/767 |
| 4,074,195 | 2/1978 | Hunt | 324/767 |
| 4,763,066 | 10/1988 | Yeung et al. | 324/537 |
| 4,860,227 | 8/1989 | Tamamura | 324/607 |
| 4,965,516 | 10/1990 | Parshotam et al. | 324/607 |
| 5,245,295 | 9/1993 | Hata et al. | 324/683 |
| 5,266,901 | 11/1993 | Woo | 324/537 |
| 5,287,065 | 2/1994 | Allfather | 324/683 |

*Primary Examiner*—Ernest F. Karlsen
*Attorney, Agent, or Firm*—Richard A. Tomlin; Ronald V. Davidge

[57] ABSTRACT

A PLL (phase-locked loop) circuit is used in apparatus for testing individual circuits in circuit devices. The PLL circuit operates at an input frequency provided by the output of an input oscillator when this oscillator is connected to one of the inputs of a phase comparator within the PLL circuit. When this connection is not made, the PLL circuit operates at a freerunning frequency, which is varied by connecting a circuit under test with a frequency controlling node present within a voltage-controlled oscillator in the PLL circuit. In a first mode of operation, the circuit under test is initially connected to the frequency controlling node, but the input oscillator is not connected to the phase comparator. When the input oscillator is so connected, the frequency of oscillations moves from a freerunning frequency associated with the circuit under test to the input frequency. During this transient behavior, the output of a loop filter within the PLL circuit is periodically sampled and encoded using an ADC (analog to digital converter) circuit. In a second mode of operation, the circuit under test is initially not connected to the PLL circuit, but the input oscillator is initially so connected. When the circuit under test is connected, transient behavior is caused, which is again recorded using the ADC. In either case, codes generated by the ADC circuit are read by the processor of a computing system for comparison with codes similarly generated using a circuit known not to have fault conditions.

9 Claims, 3 Drawing Sheets

APPARATUS AND METHOD FOR TESTING CIRCUITS BY THE RESPONSE OF A PHASE-LOCKED LOOP

BACKGROUND OF THE INVENTION

1. Field of the Invention

This invention relates to a method for detecting wiring faults and, more particularly, to a method for detecting such faults in a circuit device through measuring the response of a circuit node to an applied input signal.

2. Background Information

One method for testing circuit devices to determine if they have been properly fabricated in a manufacturing environment is generally called "signature analysis." Circuit devices needing this kind of testing may be, for example, circuit boards not populated with components, circuit boards fully or partially populated with components, integrated circuits, or multi-level circuit component carriers. Using signature analysis, a waveform is applied to a test node of a circuit device known to be fabricated correctly, and the response of the circuit device to the waveform is stored.

DESCRIPTION OF THE PRIOR ART

A number of U.S. Patents describe apparatus for testing electronic circuits by measuring two responses of the circuit to the application of a voltage signal in the form of a periodic function, such as a sine wave or triangular wave, to a node of the circuit under tests. The two responses are simultaneously applied to drive the horizontal and vertical amplifying stages of an oscilloscope, so that straight or curved figures appear on the screen to indicate the condition of the circuits under test. Examples of such apparatus are described in U.S. Pat. Nos. 3,973,198 and 4,074,195, both to Hunt, in which the applied signal is an AC signal derived from a step-down transformer having a primary winding at 120 volts, 60 cycles, and in U.S. Pat. No. 4,965,516. These methods require examination of the output by an operator in "real time," as the circuit is being tested.

U.S. Pat. No. 4,736,066 to Yeung et al. and U.S. Pat. No. 4,956,516 to Parshotam et al describe apparatus including a semiconductor tester producing an analog signature signal relative to a circuit node of an electronic circuit, such as a pin connection of an integrated circuit, upon the application of an excitation signal, such as a triangular wave or a sinusold to the node, as a common line is applied to a reference node of the circuit. Two signals are returned from the semiconductor tester, to be displayed, respectively, through horizontal and vertical deflections of an oscilloscope beam, forming an analog signature signal representing the circuit being tested. These two signals are each also converted into a digital format, being directed to an integrator/ADC (analog to digital converter) producing a set of four digital signals representing the analog signature signal. In the apparatus of Yeung, these digital signals are then compared in a computer against reference digital values for the same circuit node of the same electronic circuit which is known to be good. If the digital signals are not within a selected range relative to the reference digital values, the analog signature of the circuit node is displayed for inspection and evaluation by an operator. In the apparatus of Parshotam, these digital signals are stored in memory, and analog signatures corresponding to both the test and reference digital signals are then reconstructed for display and superimposed, for viewing by an operator.

U.S. Pat. No. 5,266,901 to Woo describes a transient analysis method used with the application of a rectangular pulse to the network being tested. A signal in response to this stimulus pulse, provided across an external capacitor and resistor connected to the reference plane of a circuit board or substrate, is sampled by a transient analyzer. The leading edge of the response signal provides an indication of whether the net being tested is acceptable opened, shorted, or has a high leakage resistance to another net.

While the prior art methods described above provide various ways, which are not necessarily include signature analysis, to analyze individual nets or circuits, they are all limited by the type of actuation signal which is applied. In the case of Woo, the response, of the circuit being tested, to a single rectangular pulse is measured. In the other devices, the response to steady-state AC signals is measured. What is needed is a method for measuring the response of the circuit to both steady-state sinusoidal input and to transient conditions. Furthermore what is needed is an interface to tie the circuit testing apparatus to a computing system so that the computing system can determine the sequence of signal application from two or more possible sequences, in response to a program being executed within the computer system.

U.S. Pat. No. 5,245,295 to Hata et al describes a method for detecting a variation in stray capacitance with a PLL (phase-locked loop) circuit. In one embodiment of the Hata apparatus, the circuit being measured is electrically connected to a circuit consisting of a resistor and a capacitor, which is used to determine the freerunning frequency of the voltage controlled oscillator within the PLL circuit. A phase comparator within the PLL circuit detects phase differences between an output signal provided by a pre-oscillator and the output signal of the voltage controlled oscillator. The output of this phase comparator is provided as an input to an output low-pass filter external to the PLL circuit and to a loop filter within the PLL circuit. The output of the output low-pass filter is in turn provided as an input to a digital output circuit. The output of the loop filter is provided as a controlling input to the voltage controlled oscillator and simultaneously as an input to an analog output amplifier outside the PLL circuit.

The Hata apparatus is used to detect changes in capacitance, as a body is brought into contact with a probe, or as a body is brought into close proximity to a probe, changing the stray capacitance of a circuit of which the probe is a part. In the absence of such changes in capacitance, the preoscillator and the voltage controlled oscillator run in a locked condition, at the same operating frequency with a relative phase angle of ninety degrees. Under this locked condition, the phase comparator within the PLL circuit provides an output signal at a zero level, resulting in a zero-level output signal from both the output low-pass filter and from the digital output circuit. Similarly, under this locked condition, the loop filter of the PLL circuit and the external analog output amplifier provide zero-level outputs. On the other hand, when the level of capacitance being measured varies, the oscillation frequency of the voltage controlled oscillator fluctuates before returning to a locked condition. During this fluctuation, the phase comparator produces a positive or negative output voltage at all times when its input signals are not separated by a phase angle of ninety degrees. The output signal from the phase comparator is passed through the low-pas filter, resulting in the generation of characteristic codes by the digital output circuit. Similarly, the loop filter within the produces a signal indicating that such fluctuations are occurring, which is in turn amplified by the analog output amplifier external to the PLL circuit.

Thus, the Hata apparatus may be used, for example, to sound an alarm indicating that an intruder has entered a space. This type of application is substantially different from a circuit analysis, such as a signature analysis, application, in that the presence of the intruder has only to be detected; it is not necessary to make judgements about his height, weight, or other physical characteristics. To this end, the Hata apparatus uses a circuit providing an output whenever a measurable change in capacitance occurs. For the successful application of the Hata detection apparatus to a circuit testing application, a method must be found to store and manipulate absolute levels of circuit perturbation, rather than to detect simply that a perturbation is presently occurring.

SUMMARY OF THE INVENTION

In accordance with one aspect of the invention, there is provided apparatus for determining electrical characteristics of a circuit under test. The apparatus includes a computing system, an input oscillator, a phase-locked loop, first and second connection mechanisms, a detection mechanism, a switching mechanism, and an analog to digital converter. The input oscillator provides an output at an input frequency of oscillation. The phase-locked loop includes a phase comparator, a loop filter, and a voltage controlled oscillator. The phase comparator has first and second inputs. The first input is connected to an output of the voltage controlled oscillator, which has a freerunning frequency of oscillation at which the phase-locked loop operates when the input oscillator is not connected to the phase comparator. The phase-locked loop oscillates at the input frequency when the input oscillator is connected to the phase comparator. The voltage controlled oscillator includes a frequency node at which the freerunning frequency of oscillation is varied by attaching an electrical impedance extending to electrical ground. The first connection mechanism connects the input oscillator with the second input of the phase comparator. The second connection mechanism connects a node of the circuit under test with the frequency control node. The detection mechanism measures an output signal of the loop filter. The switching mechanism, which can be operated by the computing system, is for closing an electrical connection to the phase-locked loop to begin generating data relative to the circuit under test. The analog to digital converter responds to an output signal from the detection mechanism, producing coded signals indicating levels of the output signal of the loop filter at sampling times synchronized with the operation of the switching means, so that the sampling times when the electrical connection to the phase lock loop is closed and, afterward, at a number of equal time intervals.

DETAILED DESCRIPTION

Figure 1:
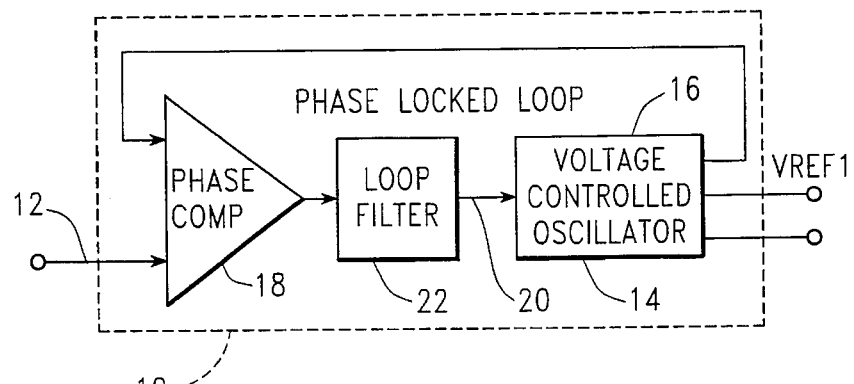
FIG. 1 is a block diagram of a phase-locked loop circuit as known in the art.

FIG. 1 is a block diagram of a PLL (phase-locked loop) circuit 10 as known in the art, and as described particularly in U.S. Pat. No. 5,245,295 to Hata et al. This circuit oscillates at an external input frequency provided at input line 12, as a freerunning frequency of voltage controlled oscillator 14 is changed within an allowable range. An output frequency is provided from the voltage controlled oscillator 14 on line 16, to be compared with the input frequency within a phase comparator 18. The oscillation frequency of voltage controlled oscillator 14 is determined by a control voltage provided on line 20 as an output of loop filter 22.

Phase comparator 18 provides an output voltage on line 24 at a zero level when its two inputs, the external input frequency signal on line 12 and the output signal of voltage controlled oscillator 14, are 90 degrees out of phase. Thus, whenever these inputs are at different frequencies, the voltage on line 24 varies between positive and negative values, going through zero as the input signals go through the condition of being 90 degrees out of phase. When these two inputs are at the same frequency but not 90 degrees out of phase, a positive or negative voltage, depending on the phase relationship, is present on line 24. Loop filter 22 integrates a variable voltage signal present on line 24, generating a direct current voltage provided on line 20 as the control voltage for voltage controlled oscillator 14, increasing or decreasing the output frequency of this oscillator 14 so that it is equalized to the input frequency provided on line 12.

An initialization process is provided for starting oscillations within the voltage controlled oscillator 14. Thus, oscillator 14 begins oscillating at a frequency determined, not by the input frequency provided on line 12, but rather at a frequency determined by a resistive and capacitive network within the oscillator 14.

Figure 2:
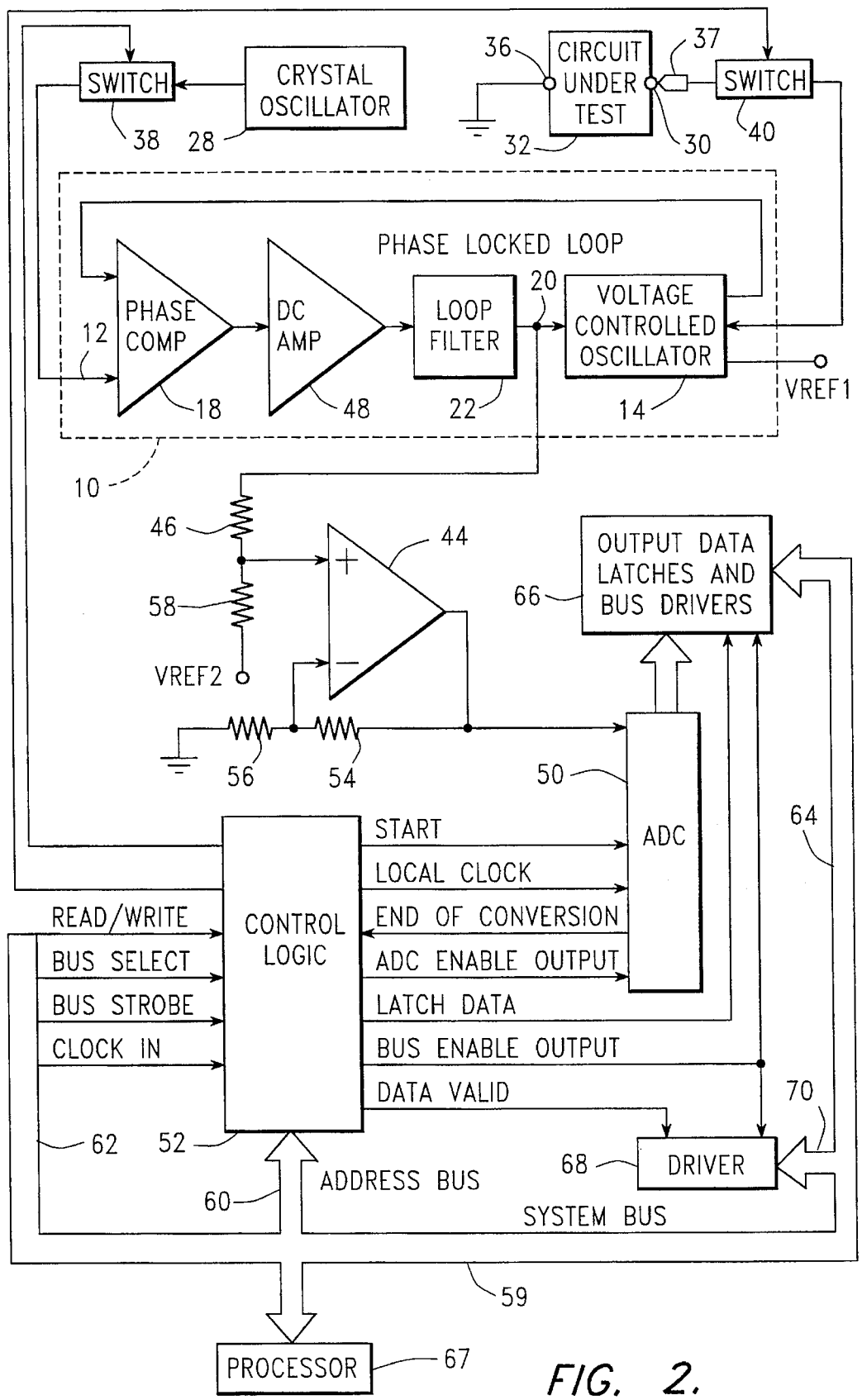
FIG. 2 is a block diagram of circuit testing apparatus built in accordance with the present invention.

FIG. 2 is a block diagram of circuit testing apparatus built in accordance with the present invention. Within this apparatus, a PLL (phase-locked loop) circuit 10 is configured to operate generally as described in above in reference to FIG. 1. Like reference numerals are applied to like components in FIGS. 1 and 2. The input frequency signal on line 12 is supplied by a crystal oscillator 28, which provides an accurately controlled frequency reference due to its inherent stability. A single node 30 of a circuit under test 32 is connected over line 34 to the frequency control node of voltage controlled oscillator 14. Another node 36 of the circuit under test 32 is connected to a reference level provided by electrical ground. These connections to circuit 32 may be made, for example, by connecting a normally grounded portion of the circuit (forming node 32) to ground, while an output pin (forming node 30) is contacted with a probe 37. Alternately, both nodes 32 and 36 may be formed by applying movable probes to nodes within the test circuit, which are not brought out as pins for external connections. In general, each circuit under test is a part of a circuit device having many, even hundreds, of circuits to be tested independently.

A switching circuit 38 is preferably included at the output of crystal oscillator 28, and a switching circuit 40 is preferably included between node 30 of the circuit under test 32 and the frequency control node within voltage controlled oscillator 14 so that electrical connections can be made in a preferred sequence during the testing process. While, under certain circumstances depending, for example, on the type of testing device used, the movement of probe 37 into contact with node 30 may be used to provide the function of switching circuit 40, the use of electronic switching methods may be favored by a desire to avoid problems which might otherwise occur due to the bouncing of a mechanical contact system following initial contact. It is furthermore understood that similar results may be obtained by making and breaking a circuit connection at the other end of circuit under test 32, i.e. between node 36 and electrical ground.

Thus, the freerunning frequency of voltage controlled oscillator 14, at which the output signal on line 16 oscillates when the input frequency of crystal oscillator 28 is not applied to phase comparator 18, is determined by a network of, for example, resistors, capacitors, and inductors within the oscillator 14, in combination with the various elements of the circuit under test 32 when it is connected to frequency control node through switch 40 and line 34. The operating characteristics of the oscillator 14 are also determined by the level of a reference voltage, VREF1, applied to the oscillator 14 through a line 42. When the input frequency provided by crystal oscillator 28 is applied to phase comparator 18, the output frequency of voltage controlled oscillator 14 is driven toward a steady-state locked frequency equal to that of the crystal oscillator 28 by means of the operation of the PLL circuit 10. If this transition from the freerunning frequency to the input frequency occurs with the circuit under test 32 connected to the frequency control node within voltage controlled oscillator 14, the rate at which the transition occurs and various other characteristics of this transition are also effected by the characteristics of the circuit under test 32.

The output signal of loop filter 22 is applied to the positive input of a differential amplifier 44 through a resistor 46. Within PLL circuit 10, a DC amplifier 48 is provided at the input of loop filter 22 to assure that sufficient current is available to drive differential amplifier 44. The output of differential amplifier 44 is in turn applied as an input to an analog-to-digital converter 50, which operates with control logic 52 to provide an interface to a computing system. The output of differential amplifier 44 is also applied to the negative input of this amplifier 44 through a resistor 54, and this negative input is furthermore tied to ground through a resistor 56. A second reference voltage, VREF2, which is applied to the positive input of differential amplifier 44 through a resistor 58, is used to establish a reference point for the analog-to-digital converter 50. Specifically, this voltage VREF2 is chosen so that, when the loop filter output voltage on line 20 is equal to zero, the input and output currents of differential amplifier 44 are also equal to zero, providing a zero-level input to the analog-to-digital convertor 50. Depending on specific circuit implementations, this condition may be reached with a positive, negative, or zero (ground) value of VREF2. The various resistors associated with inputs to differential amplifier 44, i.e. resistors 46, 54, 56, and 58, may be equal in resistance, or their resistance values may be varied to control the gain of the amplifier 44.

The analog-to-digital converter 50 and control logic 52, which may be implemented within a programmable logic device, serve as the interface between the test circuits described above and the system bus 59 of a computing system, such as a personal computer. To this end, inputs to control logic 50 are provided from the address bus 60 of system bus 59 and from various control lines 62 also present in system bus 59. Also, the outputs of analog-to-digital converter 50 are driven onto the data bus 64 of the system bus 59 through output latches and bus driver circuits 66.

Figure 3:
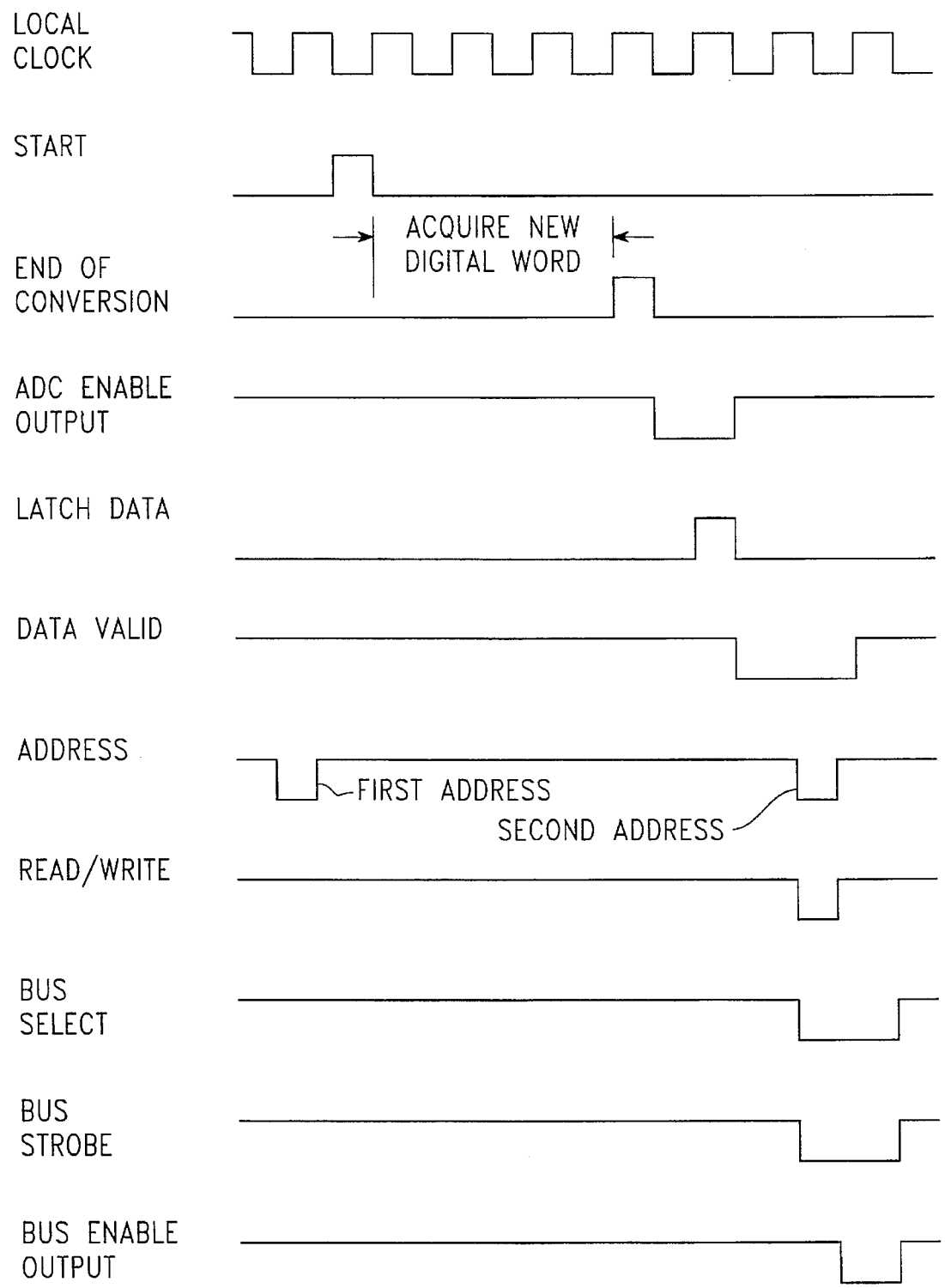
FIG. 3 is a timing diagram of the apparatus of FIG. 2, showing particularly the relationships among various control signals.

FIG. 3 is a timing diagram of the operation of the apparatus of FIG. 2, showing particularly the relationships of various control signals on control lines 62 of the system bus 59 and control signals sent between the control logic 52 and the analog-to-digital converter 50.

Referring to FIGS. 2 and 3, the operation of this apparatus preferably occurs under the control of the computer system processor 67, with a first address associated with control logic 52 being sent along address bus 60 of the computer system when a determination is made to begin the test sequence. This determination is preferably made through a software program being executed within the computer system, either in accordance with a sequence of operations listed in a computer program or in response to an operator action, such as the depression of a pointing device button (not shown). The computer system may also control other functions occurring during the testing process, such as the movement of probes among various test nodes of a circuit board.

The process of checking an individual circuit is begun by a START pulse sent from control logic 52 to the ADC circuit 50 after the control logic 52 decodes this first address. Various aspects of this operation are timed according to a LOCAL CLOCK signal sent from control logic 52 to the ADC (analog-to-digital converter) circuit 50. Following this pulse, a digital word is acquired in the ADC circuit 50, as the output of differential amplifier 44 is sampled with transitions of the LOCAL CLOCK signal. At each such sampling time, the value of the output of amplifier 44 is converted into a digital code making up part of the digital word. These digital codes are stored in registers within the ADC circuit 50. When the digital word has been completely acquired in this way, an END OF CONVERSION pulse is sent from the ADC circuit 50 to the control logic 52. After the END OF CONVERSION pulse is received, control logic 52 sends an ADC ENABLE OUTPUT pulse to the ADC circuit 50, so that the outputs of registers within ADC circuit 50 are gated to output data latches and bus drivers 66. At a transition of the LOCAL CLOCK signal occurring during the ADC ENABLE OUTPUT pulse, control logic 52 sends a LATCH DATA pulse to the output data latches and bus drivers 66, so that this data is latched.

At this point, the process of measuring a particular circuit under test 32 has been completed, with a digital word representing the measurements made using this apparatus stored in the output data latches and bus drivers circuit 66. Next, control logic 52 provides a DATA VALID indication to a Tristate driver circuit 68, which then drives a particular character, such as a binary 1111, onto the address bus lines 70 having the four highest-order bits. The processor 67 of the computer recognizes this character as indicating that data is ready to be read After this DATA VALID indication is sent, when the processor 67 of the computer system is ready to read the data stored in the output data latches and bus drivers circuit 66, it sends a second address associated with control logic along the address bus 60. Also provided on the system bus are a number of signals associated with reading data on the bus, such as the READ/WRITE signal, the BUS SELECT signal, and the BUS STROBE signal. With these signals, control logic 52 sends a BUS ENABLE OUTPUT signal to the output data latches and bus drivers circuit 66 and to the Tristate driver 68, so that the data developed during the preceding circuit test process is driven onto data bus 70, to be read by the processor 67.

The circuit b;sting apparatus can preferably be used in either of two distinctly different modes of operation. The use of different modes is provided so that the operation of the apparatus can be optimized for the type of circuit being tested and for the type of circuit faults expected.

In the first mode of operation, the PLL circuit 10 is connected to the circuit under test 40, but not to the crystal oscillator 28, before the test is begun. Thus, the circuit is operating at a frequency determined by the natural frequency of voltage controlled oscillator 14 under the conditions of the attachment of circuit under test 32. Since this frequency depends on the characteristics of the circuit 32, it provides a measure whether this circuit has been built properly. Furthermore, at the beginning of the individual circuit test, the output of crystal oscillator 28 is applied to phase comparator 18 by closing switch 38. From this point, the oscillating frequency of voltage controlled oscillator 14 is driven to the frequency of crystal oscillator 28. The characteristics of this transition between frequencies are also determined by the characteristics of the; circuit under tests 32. Therefore, to aid in the determination of the characteristics of this circuit, the output of loop filter 22 is examined during the transition phase at times determined by the LOCAL CLOCK signal.

In the second mode of operation, the PLL circuit 10 is connected to the crystal oscillator 28 before the circuit test is begun. Thus, before the test of an individual circuit is begun, the PLL circuit 10 is oscillating at the input frequency of the oscillator 28. The process of testing an individual circuit is begun by closing switch 40 to connect the circuit to be tested 32 to the frequency control node of voltage controlled oscillator 14. Unless the circuit under test happens to be an open circuit, when this connection is made, the operation of the PLL circuit 10 is disturbed in such a way that the frequency of oscillation is perturbed. However, since the connection between crystal oscillator 28 and phase comparator 18 throughout the testing process, the oscillating frequency returns to locked operation at the frequency of crystal oscillator 28. However, various aspects of the transient process occurring as the frequency leaves and returns to that of crystal oscillator 28 are determined by the particular characteristics of circuit under test 32.

In either mode of operation, the digital word generated by ADC circuit 50 is dependent on the fixed voltage VREF1 supplied to voltage controlled oscillator 14, on the circuits within the voltage controlled oscillator 14, and on the configuration and values of the network created by the manufacturing process to extend within the circuit under test 32, between nodes 30 and 36.

Figure 4:
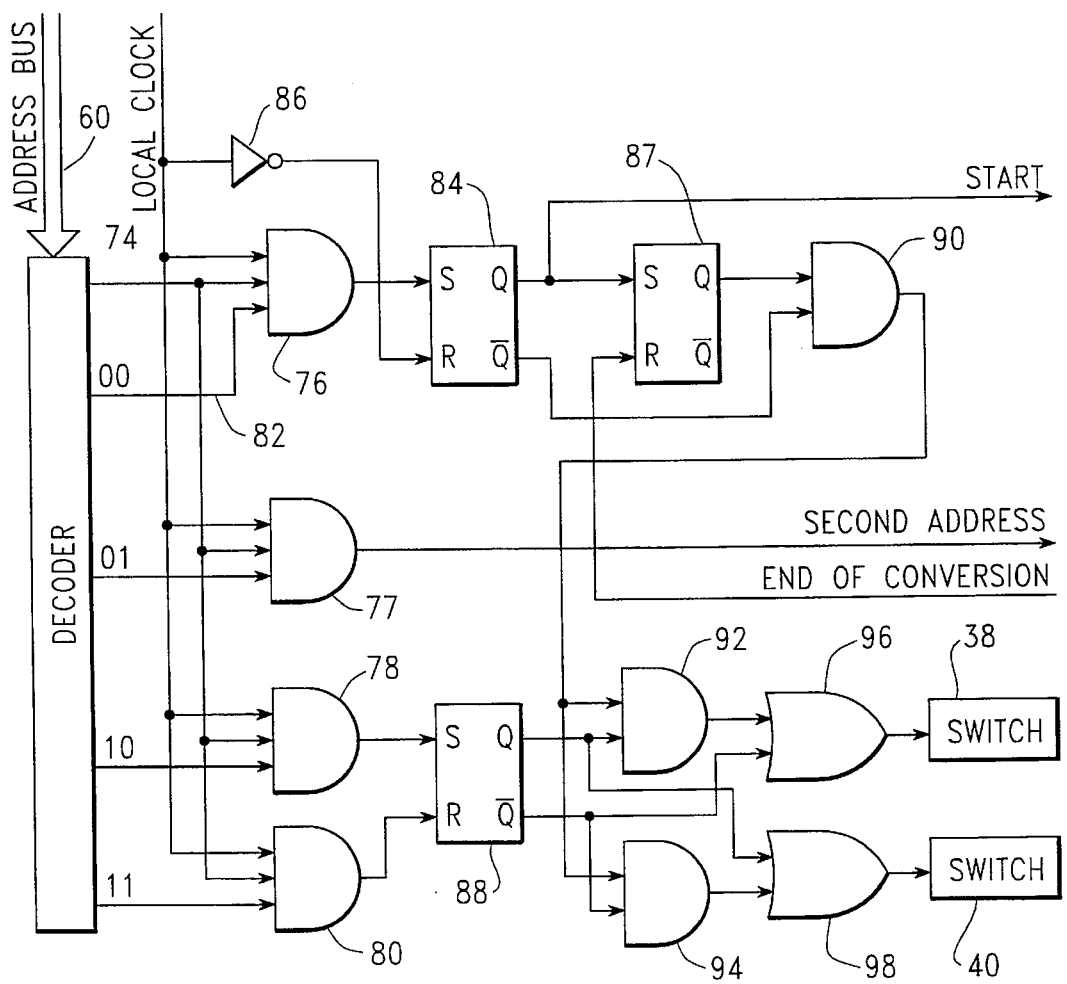
FIG. 4 is a schematic diagram of circuits used to determine the timing of switch closures in the apparatus of FIG. 2.

FIG. 4 is a schematic diagram showing various circuits, within control logic 52 (shown in FIG. 2), used effect these modes of operation by closing switches 32 and 38. As previously described in reference to FIG. 2, switch 32 is part of a circuit connecting a node 30 of the circuit under test 32 with the frequency control node of voltage controlled oscillator 14, and switch 38 is part of a circuit connecting the output of crystal oscillator 28 to an input of phase comparator 18.

Referring to FIGS. 2 and 4, the address bus 60 is provided as inputs to a decoder 72, which examines a group of bits, such as An . . . A2 to determine when an address which has been assigned to the control logic block 52 is present on the address bus 60. Some or all of the remaining bits, such as A1 and A0, are used to determine which of several actions are required for each address directed to the control logic 52. In the example of FIG. 4, when A1 and A0 are both zero, with the appropriate address being included in An . . . A2, the process of examining an individual circuit under test 32 is begun with the START signal being sent to the ADC circuit 50. In the previous discussion in reference to FIG. 3, this address has been called the "first address." When A1 is zero and A0 is one, with the appropriate address being included in An . . . A2, the address which has been called the "second address" in the discussion in reference to FIG. 3 is present, indicating that the processor 67 is ready to receive circuit test data from data bus 64. When A1 is one and A0 is zero, with the appropriate address included in An . . . A2, the operating mode of the apparatus is switched to the first mode of operation, as described above in reference to FIGS. 2 and 3, in which the connection of the PLL circuit 10 with crystal input oscillator 28 is closed and opened through switch 38 during the testing of an individual circuit 32. When A1 and A0 are both one, with the appropriate address included in An . . . A2, the apparatus is switched to the second mode of operation, in which the connection of the PLL circuit 10 with the circuit under test 32 is closed and opened through switch 40 during the testing of an individual circuit 32.

Whenever the bits An . . . A2 are determined to indicate that control logic 52 is being addressed, decoder 72 provides an output signal on line 74, which, together with a timing input from the LOCAL CLOCK signal, enables AND gates 76, 77, 78, and 80. If bits A1 and A0 are both zero, decoder 72 provides an output signal on line 82, so that, when AND gate 76 is enabled, a first latch 84 is set. The output of latch 84 provides the START pulse to begin operation of the ADC circuit 50, which continues only for the duration of a LOCAL CLOCK pulse, since first latch 84 is reset by the inverse of the LOCAL CLOCK signal, through inverter 86, following this pulse. The output of first latch 84 also sets second latch 87, which is subsequently reset by the END OF CONVERSION signal when the operation of ADC circuit 50 is completed.

If bit A1 is zero and bit A0 is one, while AND gate 77 is enabled as described above, a SECOND ADDRESS signal is provided as an output of this gate 77. This signal indicates that the "second address" has been sent by processor 67, which is now ready to read circuit test data on data bus 64. This SECOND ADDRESS signal is used within control logic 52 determining that the BUS ENABLE OUTPUT signal should be sent to output data latches and bus drivers circuit 66 and to Tristate driver circuit 68 with the next system bus cycle.

A third latch 88 is used to determine whether the apparatus will operate in its first mode of operation or in its second mode of operation, as discussed above. If bit A1 is one and bit A0 is zero, while AND gate 78 is enabled as described above, latch 88 is set. If both bits A1 and A0 are one, while AND gate 78 is so enabled, latch 88 is reset. Thus an address ending in 10 is used to set latch 88, switching operation of the apparatus to the first mode of operation, while an address ending in 11 is used to reset latch 88, switching operation of the apparatus to the second mode of operation. In each of the modes of operation, one of the switches 32 or 38 is switched on only during the development of test data for a circuit under test 32. The timing for developing test data is determined by second latch 87 being set while first latch 84 is in a reset condition, as indicated by the output of AND gate 90, which is provided as an input to each AND gate 92 and 94, enabling the operation of the switch which is to be closed only during the development of test data. If the apparatus is being operated in the first mode of operation, with third latch 88 set, the input to OR gate 96 through AND gate 92 causes the switch 38 to be closed during the development of test data, and the input to OR gate 98 from latch 88 causes the switch 90 to be closed at all times. On the other hand, if the apparatus is being operated in the second mode of operation, with third latch 88 in an unlatched condition, the input to OR gate 98 through AND gate 94 causes the switch 40 to be closed during the development of test data, and the input to OR gate 96 from latch 88 causes the switch 38 to be closed at all times.

The ability of apparatus built in accordance with the present invention to operate in these different modes of operation provides significant advantages over the prior art. For example, while the use of a PLL circuit as described in U.S. Pat. No. 5,245,295 to Hata et al. provides a detection circuit indicating a presently-occurring change in capacitance, the first mode of operation of the present invention provides an opportunity to examine the operating frequency of the PLL at a natural frequency determined with the circuit under test connected to the voltage controlled oscillator of the PLL. Compared to other examples of the prior art, the present invention additionally offers an ability to observe both transient and steady-state behavior of the circuit under test. Furthermore, the present invention offers an interface allowing a computer system to control the operation and sequencing of test procedures.

Apparatus built according to the present invention may be used, for example, in the testing of circuit devices through signature analysis. With this method a faultfree (known good) circuit device, such as a device carrier, is placed in the apparatus to be tested. A digital word is independently generated for each individual circuit to be tested and is stored under control of processor 67. In general, such data is stored in a hardfile or in other non-volatile storage. Next, another circuit device, generally identical to the fault-free component but having unknown fault conditions (if any) is placed in the apparatus to be tested in the same way. Again, a digital word is independently generated for each individual circuit to be tested and is also recorded. Finally, a comparison is made between the data collected for each of these circuit devices, on a circuit-by-circuit basis. If all of the data is matched within a predetermined tolerance window, the circuit device is passed; otherwise, the circuit device is failed.

This method is readily adapted to the production environment. After the digital words corresponding to a single fault-free circuit device are stored, a large number of manufactured circuit devices can be tested. The process of comparing the digital words recorded for each device may occur along with the generation of these digital words, after the generation of such data for the individual device has occurred, or after the generation of such data for many such devices has been completed.

While the configuration and component values of the circuits under test may be completely unknown to an individual testing an individual circuit device or analyzing the results of such testing, the various data words generated during the testing process by ADC circuit 50 uniquely identify the characteristics of each circuit path tested. Any changes to the circuit under test 32, either in component values, configuration, or through the addition of deletion of components, changes the value of the digital word generated during the test process. While this method does not measure the traditional values of capacitance, inductance, and resistance within the circuit under test 32, it depends on the transient behavior of this circuit 32. This method can readily identify opens and shorts between the nodes 30 and 36 of the circuit under test 32.

While the invention has been described in its preferred form or embodiment with some degree of particularity, it is understood that this description has been given only by way of example and that numerous changes in the details of construction, fabrication and use, including the combination and arrangement of parts, may be made without departing from the spirit and scope of the invention.

What is claimed is:

1. Apparatus for determining electrical characteristics of a circuit under test, wherein said apparatus comprises:

a computing system;

an input oscillator providing an output at an input frequency of oscillation;

a phase-locked loop including a phase comparator, a loop filter, and a voltage controlled oscillator, wherein said phase comparator has first and second inputs, with said first input being connected to an output of said voltage controlled oscillator, wherein said voltage controlled oscillator has a freerunning frequency of oscillation at which said phase-locked loop operates when said input oscillator is not connected to said phase comparator, wherein said phase-locked loop oscillates at said input frequency when said input oscillator is connected to said phase comparator, wherein said voltage controlled oscillator includes a frequency control node at which said freerunning frequency of oscillation is varied by attaching an electrical impedance extending to electrical ground;

first connection means connecting said input oscillator with said second input of said phase comparator;

second connection means connecting a node of said circuit under test with said frequency control node;

detection means measuring an output signal of said loop filter;

switching means, operable by said computing system, for closing an electrical connection to said phase-locked loop to begin generating data relative to said circuit under test; and an analog to digital converter responding to an output signal from said detection means, wherein said analog to digital converter produces coded signals indicating levels of said output signal of said loop filter at sampling times synchronized with operation of said switching means, so that said sampling times occur when said electrical connection to said phase lock loop is closed and at a plurality of equal time intervals thereafter.

2. The apparatus of claim 1:

wherein said computing system comprises a processor, an address bus, and a data bus; and wherein said apparatus additionally comprises a decoder providing a first decoder output signal when a first address is sent along said address bus and a second decoder output signal when a second address is sent along said address bus, data latch means for storing said coded signals, first control means operating said switching means in response to said first decoder output signal, and second control means driving contents of said data latch means onto said data bus in response to said second decoder output signal.

3. The apparatus of claim 1, wherein said switching means includes first switching means for opening and closing said first connection means.

4. The apparatus of claim 1, wherein said switching means includes second switching means for opening and closing said second connection means.

5. The apparatus of claim 4, wherein said first switching means includes a movable probe contacting said node of said circuit under test.

6. The apparatus of claim 4, wherein said switching means includes first switching means for opening and closing said first connection means.

7. The apparatus of claim 6:

wherein said apparatus is operable in a first mode of operation, in which said second switching means holds said second connection means closed while said first switching means closes and opens said first connection means, with said sampling times occurring when said first connection means is closed and at a plurality of equal intervals thereafter; and wherein said apparatus is additionally operable in a second mode of operation, in which said first switching means holds said first connection means closed while said second switching means closes and opens said second connection means, with said sampling times occurring when said second connection means is closed and at a plurality of equal intervals thereafter.

8. The apparatus of claim 7, comprising in addition mode control means, responsive to said computing system, for determining whether said apparatus operates in said first mode of operation or in said second mode of operation.

9. The apparatus of claim 7:

wherein said computing system comprises a processor, an address bus, and a data bus; and wherein said apparatus additionally comprises a decoder providing a first decoder output signal when a first address is sent along said address bus, a second decoder output signal when a second address is sent along said address bus, a third decoder output signal when a third address is sent along said address bus, and a fourth decoder output signal when a fourth address is sent along said address bus, with said apparatus additionally comprising data latch means for storing said coded signals, first control means operating said switching means in response to said first decoder output signal, second control means driving contents of said data latch means onto said data bus in response to said second decoder output signal, and mode control means set for operation of said apparatus in said first mode of operation in response to said third decoder output signal and reset for operation of said apparatus in said second mode of operation in response to said fourth decoder output signal.

* * * * *